United States Patent
Kanai et al.

(10) Patent No.: US 6,433,654 B1
(45) Date of Patent: Aug. 13, 2002

(54) LAMINATED PIEZOELECTRIC COMPONENT

(75) Inventors: Shungo Kanai, Toyama; Masao Gamo, Takaoka, both of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/574,884

(22) Filed: May 19, 2000

(30) Foreign Application Priority Data

May 25, 1999 (JP) .......................................... 11-145544

(51) Int. Cl.$^7$ .............................. H03H 9/05; H03H 9/58
(52) U.S. Cl. ........................................ 333/189; 333/187
(58) Field of Search ................................. 333/189, 187; 310/366, 349

(56) References Cited

U.S. PATENT DOCUMENTS

| | | | |
|---|---|---|---|
| 3,665,225 A | * | 5/1972 | van den Heuvel et al. . 310/313 B |
| 5,406,230 A | * | 4/1995 | Yamamoto ................... 331/46 |
| 5,543,106 A | * | 8/1996 | Nakashima .................. 264/430 |
| 5,844,348 A | * | 12/1998 | Gamo ......................... 310/340 |
| 6,002,308 A | * | 12/1999 | Gamo ......................... 333/187 |
| 6,011,451 A | * | 1/2000 | Gamo ......................... 333/189 |
| 6,160,462 A | * | 12/2000 | Sugiyama et al. ........... 333/189 |

FOREIGN PATENT DOCUMENTS

JP      10-284985 A    * 10/1998        H03H/9/17

* cited by examiner

*Primary Examiner*—Robert Pascal
*Assistant Examiner*—Dean Takaoka
(74) *Attorney, Agent, or Firm*—Keating & Bennett, LLP

(57) ABSTRACT

A laminated piezoelectric component or filter is arranged such that a change in the resonance frequency before and after a high temperature heat treatment such as reflowing is minimized and the distribution of the resonance frequency is also minimized. The laminated filter includes a piezoelectric substrate having a vibrating electrode provided on the back surface of the substrate, cover substrates, and adhesives located between the piezoelectric substrate and cover substrate. The change in the center frequency Fo due to the heat applied to the piezoelectric substrate during reflowing is canceled by the change of the center frequency Fo caused by the synthesized stress imparted to the piezoelectric substrates from the cover substrates and adhesives.

17 Claims, 7 Drawing Sheets

LAMINATED PIEZOELECTRIC COMPONENT

BACKGROUND OF THE INVENTION

1. Field of the Invention

The present invention relates to a laminated piezoelectric component, particularly to a laminated piezoelectric component for use with oscillators and filters.

2. Description of the Related Art

Conventional piezoelectric components include piezoelectric ceramic substrates having vibrating electrodes provided on a surface thereof. The vibrating electrodes are sealed by sandwiching them between two cover substrates via adhesives. Various adhesives have been used depending upon the structure and characteristics of the piezoelectric component and the bonding strength of the adhesive. The thickness of the adhesive is relatively small and the specific thickness is determined based upon the sealing property of the vibration space and prevention of breakage of external electrodes.

When the piezoelectric component is subjected to a high temperature heat treatment, such as reflowing, the crystalline structure of a portion of the piezoelectric ceramic substrate is altered by the heat of reflowing, thereby a resonance frequency Fo (the center frequency of a piezoelectric filter, or the oscillation frequency of an oscillator) differ before and after reflowing. Accordingly, a correction should be provided to account for the change of the resonance frequency Fo due to the heat of reflowing, otherwise the resonance frequency Fo of the piezoelectric component after reflowing varies greatly.

SUMMARY OF THE INVENTION

In order to overcome the problems described above, preferred embodiments of the present invention provide a laminated piezoelectric component which minimizes the degree of change of the resonance frequency before and after being subjected to a high temperature heat treatment, such as reflowing, and further minimizes the distribution of the resonance frequency.

Preferred embodiments of the present invention provide a laminated piezoelectric component having piezoelectric substrates on the surface of which vibration electrodes are provided, cover substrates defining a laminated body together with the piezoelectric substrates, and adhesives located between the piezoelectric substrates and the cover substrates to bond the piezoelectric substrates to the cover substrates, wherein the elasticity modulus and thickness of the adhesive are determined so that a change in the resonance frequency due to the heat applied to the piezoelectric substrate is canceled by the change in the resonance frequency caused by a synthesized stress that is imparted on the piezoelectric substrate from the cover substrate and adhesive.

The resonance frequency described herein refers to a center frequency in the case of a piezoelectric filter and the oscillation frequency in the case of an oscillator.

The synthesized stress imparted on the piezoelectric substrate from the cover substrate and adhesive is controlled by the modulus of elasticity and thickness of the adhesive. Practically, the modulus of elasticity c and the thickness $b_2$ of the adhesive are determined such that the calculated value using the following equation is approximately zero:

$$a_2 \times b_2 - a_3 \times b_3 - a_1 \times b_1 \times \exp[-(b_2/c^2) \times 10^7]$$

where $a_1$ (/°C.) and $b_1$ (μm) denote the thermal expansion coefficient and thickness of the cover substrate, respectively, $a_2$ (/°C.), $b_2$ (μm) and c (MPa) denote the thermal expansion coefficient, thickness and modulus of elasticity of the adhesive, respectively, and $a_3$ (/°C.) and $b_3$ (μm) denote the thermal expansion coefficient and thickness of the piezoelectric substrate.

Consequently, the change of the resonance frequency due to the synthesized stress imparted on the piezoelectric substrate from the cover substrate and adhesive cancels the change of the resonance frequency due to the heat imparted on the piezoelectric substrate. As a result, the degree of change of the resonance frequency before and after a high temperature heat treatment, such as reflowing, is minimized.

The stress imparted on the piezoelectric substrate from the cover substrate is absorbed by the adhesive in the laminated piezoelectric component according to preferred embodiments of the present invention. In other words, the modulus of elasticity c and the thickness $b_2$ of the adhesive are determined such that the synthesized stress imparted on the piezoelectric substrate includes only the stress component imparted on the piezoelectric substrate from the adhesive. Actually, the value of $(b_2/c^2)$, which is a coefficient of $\exp[-(b_2/c^2) \times 10^7]$, is determined to be $5.0 \times 10^{-7}$ or more in the equation of $a_2 \times b_2 - a_3 \times b_3 - a_1 \times b_1 \times \exp[-(b_2/c^2) \times 10^7]$. This unique arrangement eliminates the influence of the cover substrate, thus allowing only a synthesized stress having a given amount of stress from the adhesive to be imparted on the piezoelectric substrate. Accordingly, the degree of change of the resonance frequency before and after a high temperature heat treatment, such as reflowing, is greatly reduced and minimized. Further, the distribution of the resonance frequency is greatly reduced and minimized.

Other features, elements, characteristics and advantages of the present invention will become apparent from the detailed description of preferred embodiments thereof with reference to the drawings attached hereto.

DETAILED DESCRIPTION OF PREFERRED EMBODIMENTS

In the following, preferred embodiments of the laminated piezoelectric component according to the present invention will be described with reference to the accompanying drawings. Each preferred embodiment is described below with reference to a filter as an example of a suitable component. However, preferred embodiments of the present invention may also be an oscillator, or other suitable electronic components.

Figure 1:
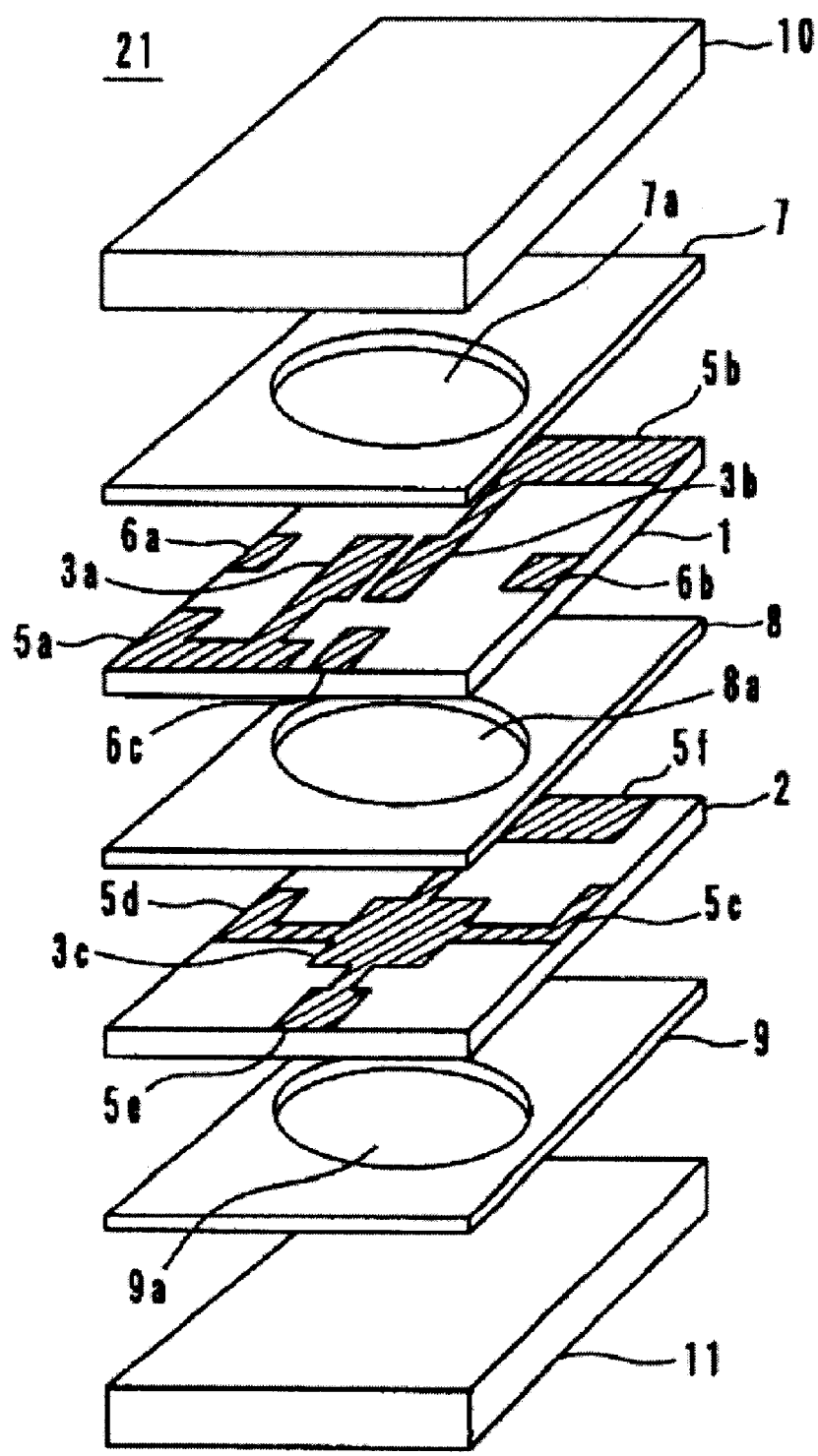
FIG. 1 is an exploded perspective view showing one preferred embodiment of the laminated piezoelectric substrate according to the present invention.

As shown in FIG. 1, a laminated piezoelectric filter 21 preferably includes a piezoelectric substrates 1 and 2, and cover substrates 10 and 11 defining vibration spaces by sandwiching the piezoelectric substrates 1 and 2 therebetween. The piezoelectric substrates 1 and 2 are preferably made of a lead titanate zirconate (PZT) based ceramic. However, quartz, $LiTaO_3$ other than PZT, and other suitable substrates may be used for the piezoelectric substrates 1 and 2.

The configuration of electrodes in the piezoelectric substrate will be described with reference to FIG. 2. The electrode on the lower surface is illustrated by a downward projection. Vibration electrodes 3a and 3b, and a vibration electrode 3c are provided on the upper and lower surfaces of the piezoelectric substrate 1, respectively. A vibration of an energy trap-type longitudinal acoustic mode along the direction of thickness is generated at the portion where the vibration electrodes 3a and 3b are opposed to the vibration electrode 3c, defining a first filter member 3.

The vibration electrodes 3a and 3b are electrically connected to lead electrodes 5a and 5b, while the vibration electrode 3c is electrically connected to lead electrodes 5c to 5f. The lead electrode 5b is opposed to the lead electrode 5f through the piezoelectric substrate 1 defining a capacitor as a relay capacitance. Electrodes 6a, 6b and 6c are provided on the upper surface of the piezoelectric substrate 1 such that electrodes 6a, 6b and 6c overlap the lead electrodes 5c, 5d and 5e, respectively, in the direction of thickness, and are electrically connected with the lead electrodes 5c to 5e. The electrodes 3a to 3c, 5a to 5f, and 6a to 6c are applied by sputtering, vacuum deposition of Ag or Cu, or other suitable methods. The areas surrounded by the dotted lines B and C on the piezoelectric substrate 1 are not polarized, while the remaining area is polarized in the direction of thickness of the substrate.

Returning to FIG. 1, the piezoelectric substrate 2 is preferably configured substantially similar to the piezoelectric substrate 1 and is oriented upside-down with respect to the orientation of the piezoelectric substrate 1. Accordingly, an energy trap-type second filter having the longitudinal acoustic mode vibration along the direction of thickness, and a capacitor as a relay capacitance are also defined by the piezoelectric substrate 2.

The cover substrates 10 and 11 preferably include a ceramic material such as alumina, and a laminated body is defined by bonding the piezoelectric substrates 1 and 2 between the cover substrates 10 and 11. The piezoelectric substrates 1 and 2 are laminated and bonded with an adhesive 8 along the direction of thickness. The cover substrate 10 is laminated and bonded on the top surface of the piezoelectric substrate 1 via an adhesive 7, while the cover substrate 11 is laminated and bonded on the bottom surface of the piezoelectric substrate 2 via an adhesive 9. Cavities 7a, 8a and 9a for defining vibration spaces of the first and second filters disposed on the piezoelectric substrates 1 and 2 are provided in these adhesives 7 to 9. The adhesives 7 and 9 will be described in detail hereinafter.

Figure 3A:
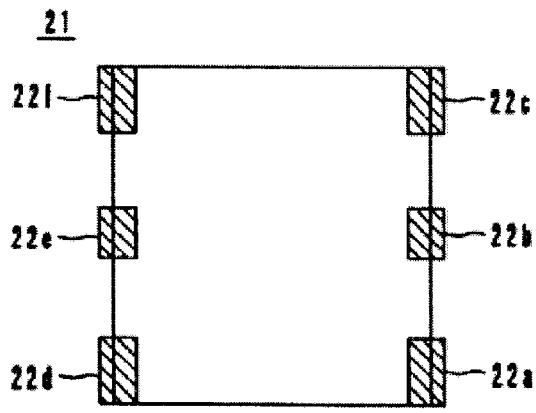
FIG. 3A shows a plane view of the laminated piezoelectric component shown in FIG. 1.
Figure 3B:
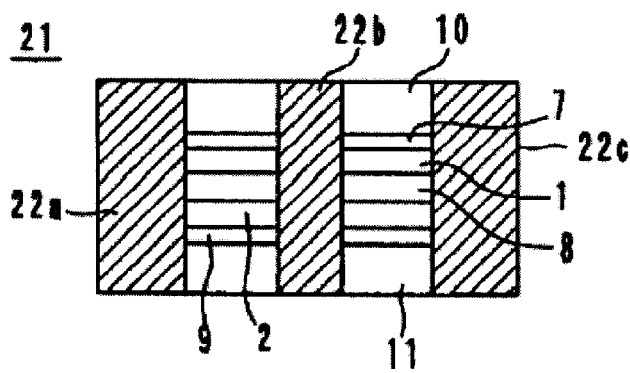
FIG. 3B shows a left-side view of the laminated piezoelectric component shown in FIG. 1.
Figure 3C:
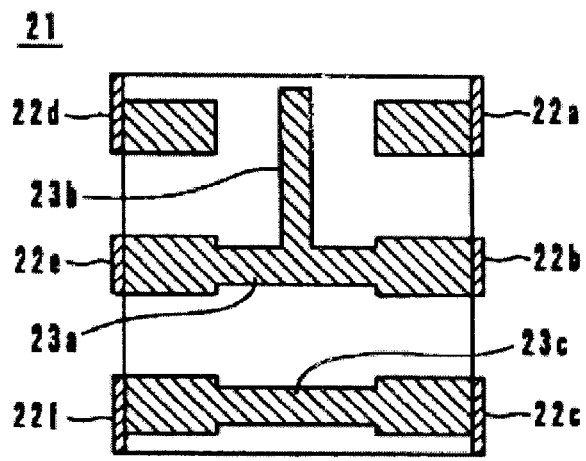
FIG. 3C shows a bottom view of the laminated piezoelectric component shown in FIG. 1.

As shown in FIGS. 3A, 3B and 3C, external electrodes are provided on the surface of the piezoelectric filter 21 and are preferably formed by sputtering, by coating and drying, or by other suitable methods. The lead electrode 5a of the piezoelectric substrate 1 is connected to the external electrode 22d, which defines an output terminal. Likewise, the lead electrode 5a from the piezoelectric substrate 2 is connected to the external electrode 22a and defines an input terminal. The external electrode 22b is connected to the electrode 6b of the piezoelectric substrate 1, and to the lead electrode 5c and the electrode 6a of the piezoelectric substrate 2. The external electrode 22c is connected to the lead electrode 5b of the piezoelectric substrate 1. The external electrode 22e is connected to the electrode 6a of the piezoelectric substrate 1, and to the lead electrode 5d and the electrode 6b of the piezoelectric substrate 2. The external electrode 22f is connected to the lead electrode 5b of the piezoelectric substrate 2. As shown in FIG. 3C, the external electrodes 22c and 22f are connected with each other via an electrical continuity member 23c, and the external electrodes 22b and 22e are connected with each other via an electrical continuity member 23a. The electrical continuity member 23c includes an extension electrode 23b, and isolation between the input and output terminals is enhanced by disposing this extension electrode 23b between the input-output external electrodes 22a and 22d.

Figure 4:
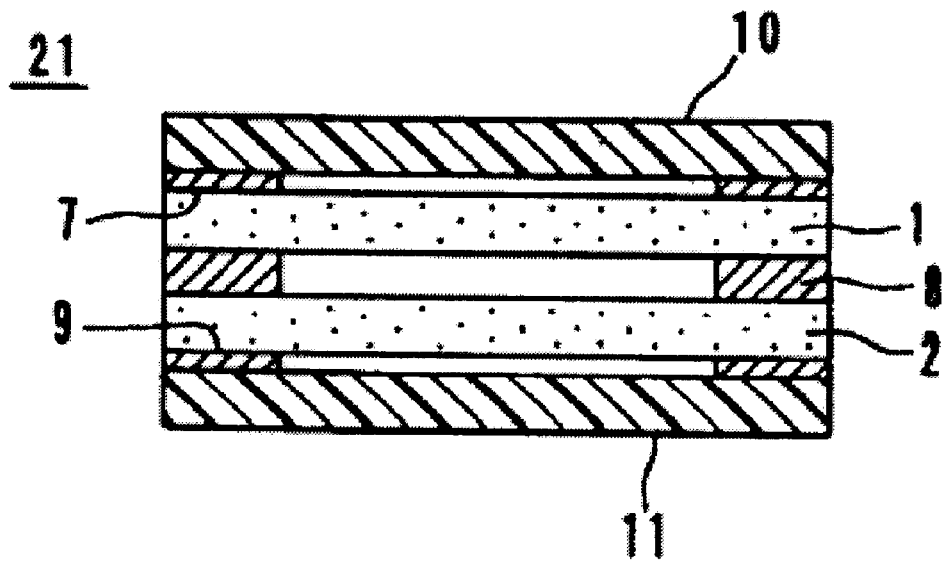
FIG. 4 shows a cross-section of the laminated piezoelectric component shown in FIG. 1.
Figure 5:
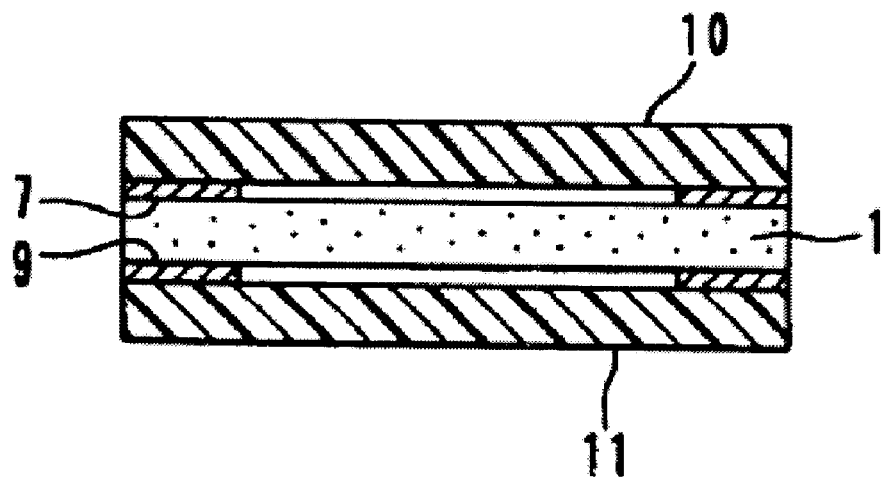
FIG. 5 is a cross-section showing another preferred embodiment of the present invention.

A two-step piezoelectric filter 21 having two filter members is obtained as described above. FIG. 4 shows a cross-section of the piezoelectric filter 21 obtained, wherein the vibration electrode and external electrodes are not illustrated.

The adhesives 7 and 9 will be described in detail hereinafter. The center frequency Fo changes before and after reflowing because of the heat applied to the piezoelectric substrates 1 and 2, when the piezoelectric filter 21 is subjected to a high temperature heat treatment such as reflowing. The piezoelectric substrates 1 and 2 also experience a stress from the cover substrates 10 and 11, and from the adhesives 7 and 9, due to differences of thermal expansion coefficients. When the piezoelectric substrates 1 and 2 are made of a ceramic substrate, the thermal expansion coefficient increased in the order of the piezoelectric substrates 1 and 2, the cover substrates 10 and 11, and the adhesives 7 and 9. Accordingly, the stress imparted from the cover substrates 10 and 11 become dominant among the stresses applied to the piezoelectric substrates 1 and 2, when the adhesives 7 and 9 have a large elasticity modulus, or when the adhesives 7 and 9 are thin. Since expansion of the cover substrates 10 and 11 turns out to be larger than expansion of the piezoelectric substrates 1 and 2 by the heat of reflowing, the piezoelectric substrates 1 and 2 experience a compression stress from the cover substrates 10 and 11, thereby the center frequency Fo shifts to the low frequency side.

When the adhesives 7 and 9 have a small elasticity modulus, or when the adhesives 7 and 9 are thick, on the other hand, the stress imparted from the cover substrates 10 and 11 is absorbed by the adhesives 7 and 9. As a result, the stress imparted from the adhesives 7 and 9 becomes dominant among the stresses applied to the piezoelectric substrates 1 and 2. Since the adhesives 7 and 9 are disposed around the vibration electrodes 3a and 3b of the piezoelectric substrates 1 and 2 as shown in FIG. 1, vibration portions of the piezoelectric substrates 1 and 2 on which the vibration electrodes 3a and 3b are disposed experience a tensile stress from the adhesives 7 and 9, when the adhesives 7 and 9 having a larger thermal expansion coefficient start contracting after being subjected to reflowing. Consequently, the center frequency shifts to the higher frequency side. In other words, the change of the center frequency Fo can be controlled by controlling the stress imparted to the piezoelectric substrates 1 and 2 by changing the elasticity modulus and thickness of the adhesives 7 and 9.

Accordingly, the change of the center frequency Fo by the heat imparted to the piezoelectric substrates 1 and 2 during reflowing is effectively canceled by the change of the center frequency Fo caused by the synthesized stress imparted to the piezoelectric substrates 1 and 2 from the cover substrates 10 and 11, and from the adhesives 7 and 9, by appropriately selecting the elasticity modulus and thickness of the adhesives 7 and 9. Consequently, a laminated piezoelectric filter 21 that is able to minimize the change quantity of the center frequency Fo before and after the high temperature heat treatment such as reflowing can be obtained.

Actually, adhesives 7 and 9 having an elasticity modulus c and thickness $b_2$ are selected so that the calculated value by the following equation is approximately zero:

$$a_2 \times b_2 - a_3 \times b_3 - a_1 \times b_1 \times \exp[-(b_2/c^2) \times 10^7] \quad (1)$$

where $a_1$ (/°C.) and $b_1$ ($\mu$m) denote the thermal expansion coefficient and thickness of the cover substrates 10 and 11, respectively, $a_2$ (/°C.), $b_2$ ($\mu$m) and c (MPa) denote the thermal expansion coefficient, thickness and elasticity modulus of the adhesives 7 and 9, respectively, and $a_3$ (/°C.) and $b_3$ ($\mu$m) denote the thermal expansion coefficient and thickness of the piezoelectric substrates 1 and 2. It is preferable that the values that makes the calculated value by the equation (1) to fall within a range of about $0 \pm 1.0 \times 10^{-4}$ are selected.

When the stress imparted to the piezoelectric substrates 1 and 2 from the cover substrates 10 and 11 is absorbed by the adhesives 7 and 9, the stress only contains a stress component that is imparted to the piezoelectric substrates 1 and 2 from the adhesives 7 and 9. Accordingly, the piezoelectric substrates 1 and 2 always experience an approximately constant stress, thereby reducing the change quantity of the center frequency Fo before and after reflowing as well as distribution thereof. More practically, the terms containing the parameters $a_1$ and $b_1$ related to the cover substrates 10 and 11 is diminished, in order to minimize the influence of the cover substrates 10 and 11 in the equation (1). That is, an adhesive 7 and 9 having an elasticity modulus c and thickness $b_2$, in which the value of $b_2/c^2$ as a coefficient of the equation $\exp[-(b_2/c^2) \times 10^{-7}]$ satisfies the following equation (2), is selected:

$$(b_2/c^2) \geq 5.0 \times 10^{-7} \quad (2)$$

The laminated piezoelectric component according to the present invention is not restricted to preferred embodiments as set forth above, but is variable within a range that does not alter the spirit of the present invention. The number of the piezoelectric substrates is not necessarily restricted to two substrates, but one piezoelectric substrate 1 may be sandwiched and sealed by two cover substrates 10 and 11. While recesses for defining vibration spaces are provided on the cover substrates in the piezoelectric component in preferred embodiments as set forth above, such recesses may be omitted and the vibration space may be provided by taking advantage of the thickness of the adhesive.

Figure 2:
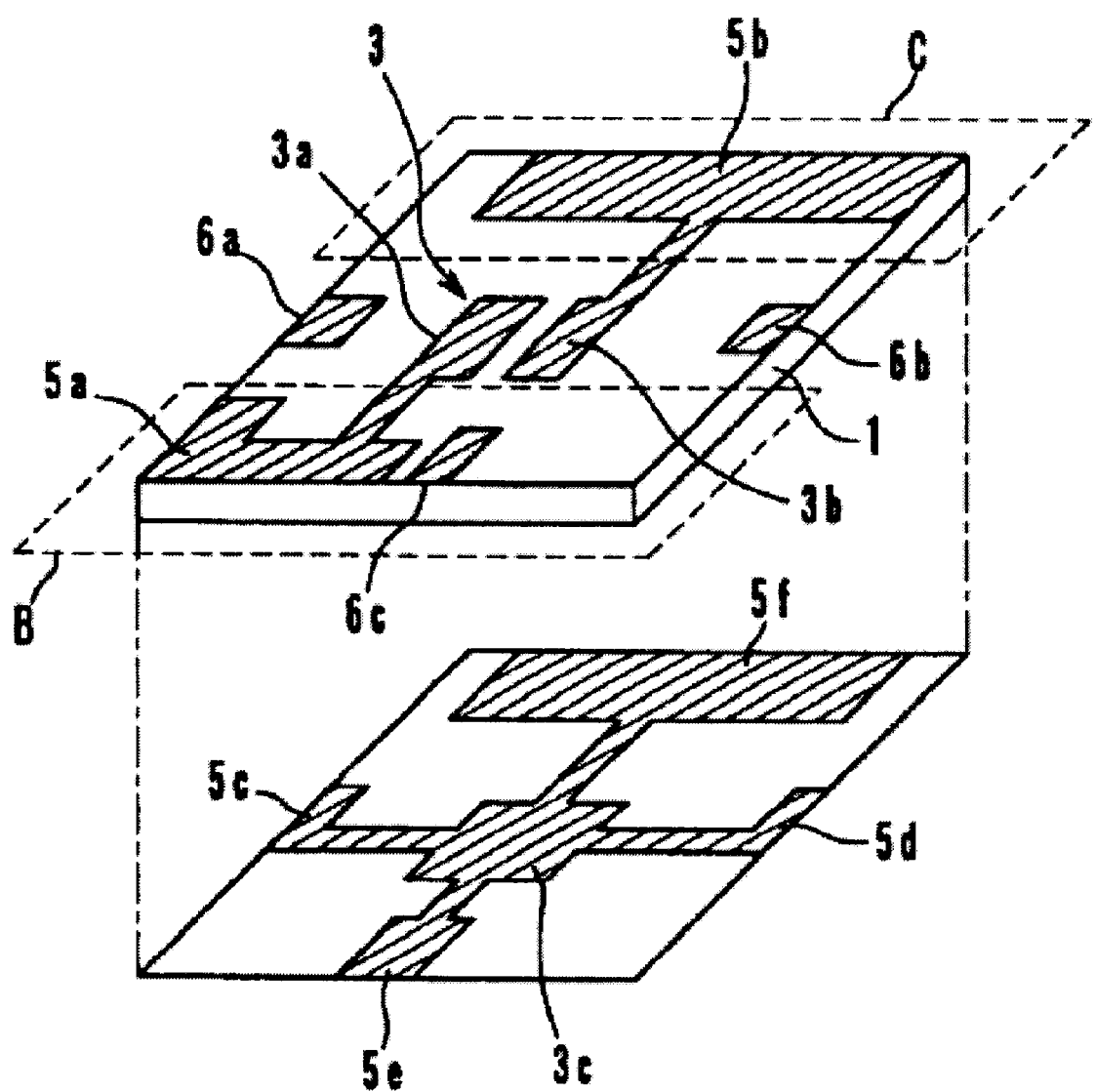
FIG. 2 is a perspective view showing the structure of the electrodes used for the laminated piezoelectric component shown in FIG. 1.

Examples of the piezoelectric filter 21 as shown in FIGS. 1 to 3 was manufactured using the cover substrates 10 and 11 having a thickness of about 500 $\mu$m and the piezoelectric substrate 1 and 2 having a thickness of about 200 $\mu$m, while using two kinds of adhesives having elasticity moduli of about 3000 MPa and about 6000 MPa as the adhesives 7 and 9. The thermal expansion coefficients of the cover substrates 10 and 11, and of the piezoelectric substrate 1 and 2 were about $7.8 \times 10^{-6}$/°C. and $2.0 \times 10^{-6}$/°C., respectively. The thermal expansion coefficients of the adhesives 7 and 9 were about $6.3 \times 10^{-5}$/°C. and $4.8 \times 10^{-5}$/°C. for those having an elasticity modulus of about 3000 MPa and about 6000 MPa, respectively.

The value of the equation (1) should be close to zero for reducing the change quantity of the center frequency Fo before and after reflowing. Accordingly, the target value of the thickness $b_2$ of the adhesives 7 and 9 may be adjusted to about 6 $\mu$m for limiting the value of the equation (1) within a range of about $0 \pm 1.0 \times 10^{-4}$, when the adhesives 7 and 9 have an elasticity modulus c of about 3000 MPa. Likewise, the target value of the thickness $b_2$ of the adhesives 7 and 9 may be adjusted to 12 $\mu$m when the adhesives 7 and 9 have an elasticity modulus c of about 6000 MPa.

Figure 6:
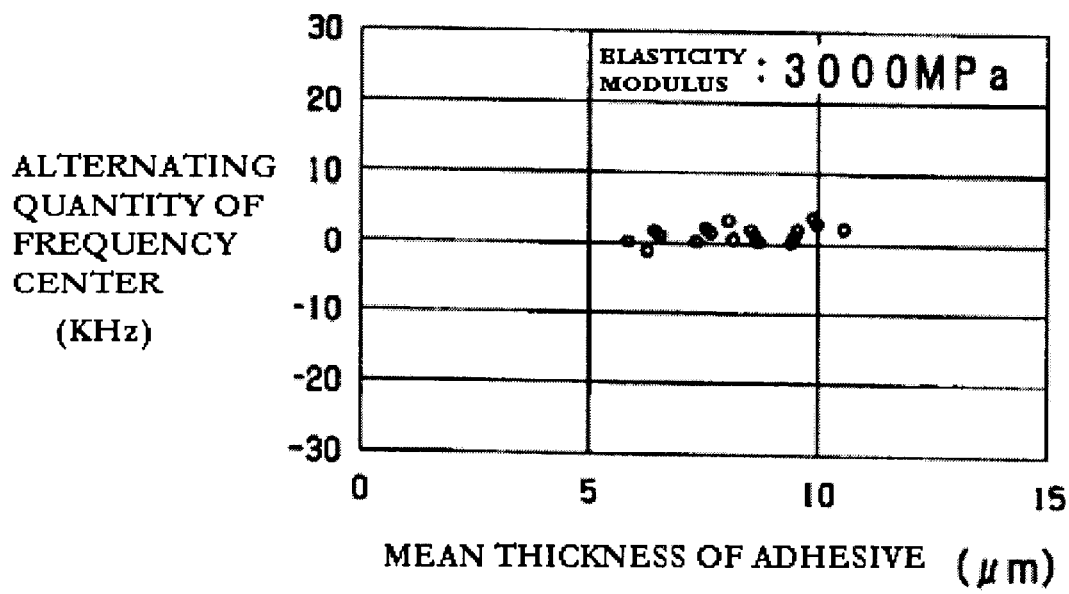
FIG. 6 is a graph showing the change quantity of the center frequency when an adhesive having an elasticity modulus of 3000 MPa.
Figure 7:
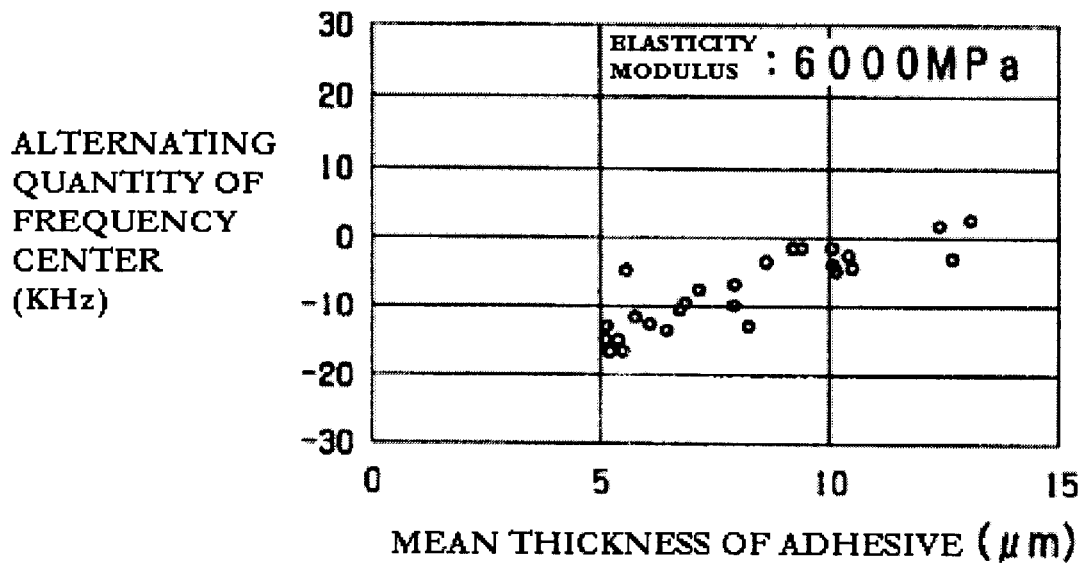
FIG. 7 is a graph showing the change quantity of the center frequency when an adhesive having an elasticity modulus of 6000 MPa.

FIGS. 6 and 7 are the graphs showing the relation between the change quantities of the center frequency Fo before and after reflowing (the change quantity after 24 hours' reflowing) and the thickness $b_2$ of the adhesives 7 and 9 when the thickness $b_2$ of the adhesives 7 and 9 is in the range of about 5 $\mu$m to 15 $\mu$m, wherein the elasticity moduli are about 3000 MPa and about 6000 MPa in FIG. 6 and FIG. 7, respectively. The graphs show that the change quantity of the center frequency is approximately zero at the target thicknesses $b_2$ of about 6 $\mu$m and about 12 $\mu$m for the adhesives 7 and 9 having an elasticity moduli c of about 3000 MPa and about 6000 MPa, respectively.

Figure 8:
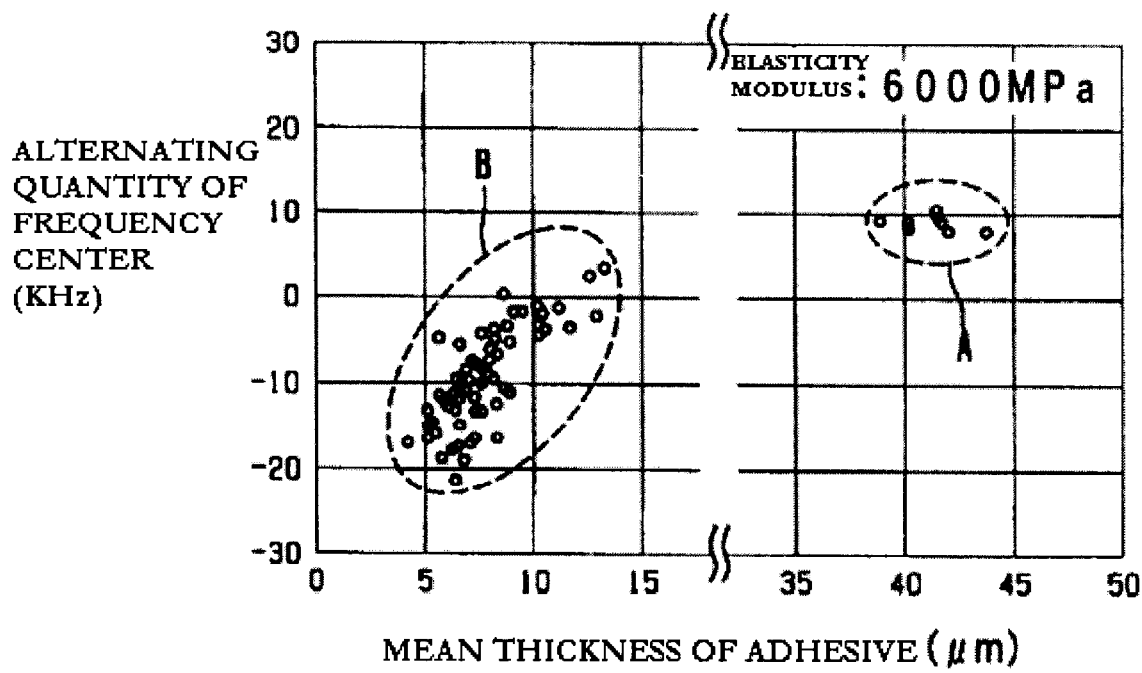
FIG. 8 is a graph showing the relation between the change quantity of the center frequency and the mean thickness of the adhesive when an adhesive with an elastic modulus of 6000 MPa is used.
Figure 9:
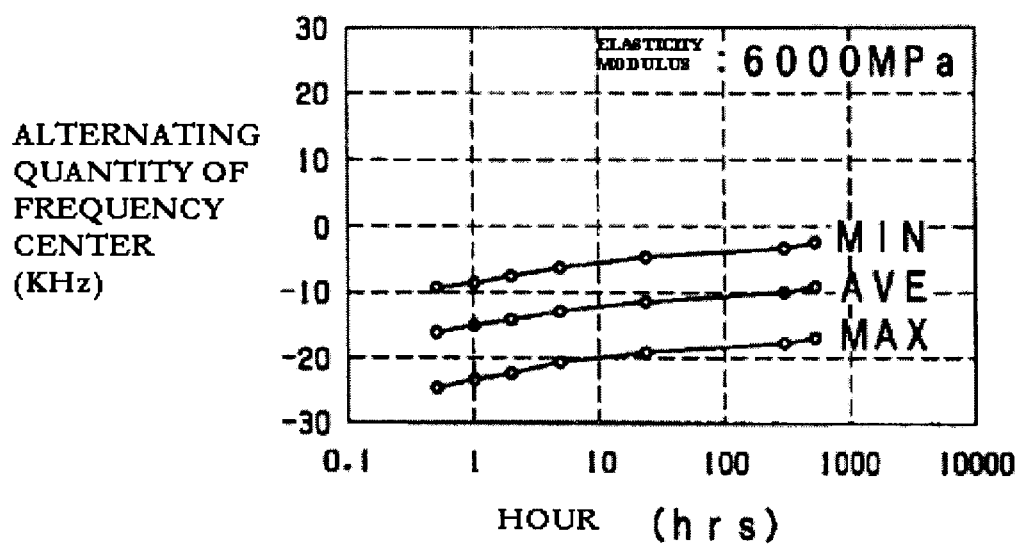
FIG. 9 is a graph showing a time dependent change when an adhesive with an elastic modulus of 6000 MPa and a mean thickness of about 5 μm to about 15 μm is used.
Figure 10:
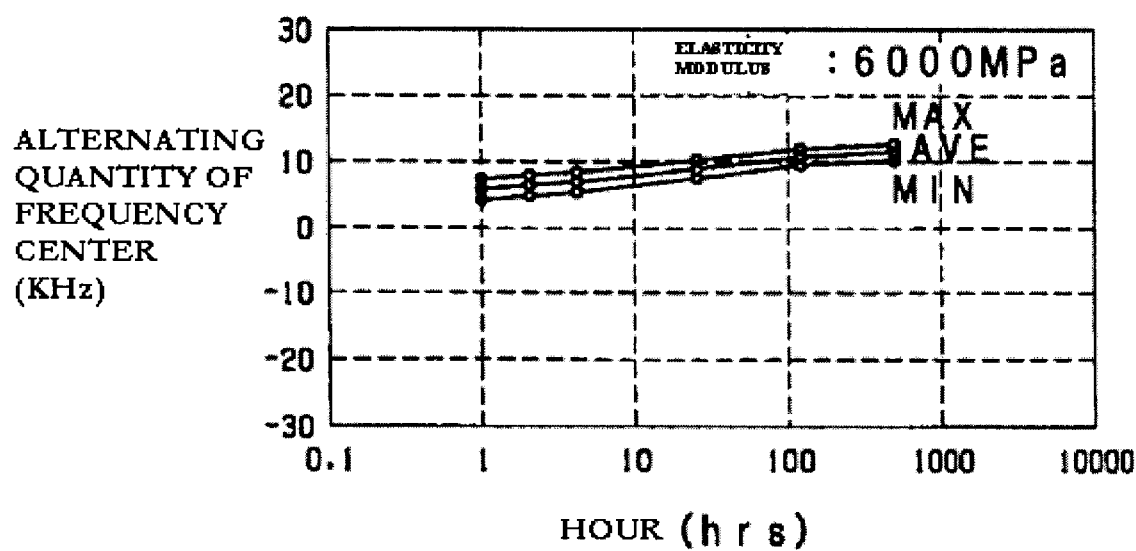
FIG. 10 is a graph showing a time dependent change when an adhesive with an elastic modulus of about 6000 MPa and a mean thickness of about 40 μm to about 45 μm is used.

The equation (2) should be satisfied in order to minimize the change quantity of center frequency Fo before and after reflowing. Accordingly, the thickness $b_2$ of the adhesives 7 and 9 should be adjusted to about 4.5 $\mu$m or more in the equation (2), when the adhesives 7 and 9 have an elasticity modulus c of about 3000 MPa. The thickness $b_2$ should be adjusted, on the other hand, to about 18 $\mu$m or more when the elasticity modulus c is about 6000 MPa. FIG. 8 is a graph showing the change quantity of the center frequency Fo before and after reflowing (the change quantity after 24 hours' reflowing) of the sample groups A and B prepared using the adhesives with a thickness $b_2$ of about 40 $\mu$m to about 45 $\mu$m and with a thickness $b_2$ of about 5 $\mu$m to about 15 $\mu$m, respectively, wherein the adhesives 7 and 9 having an elasticity modulus c of about 6000 MPa were used. Ten samples were randomly selected from the sample group B having a thickness $b_2$ of about 5 $\mu$m to about 15 $\mu$m, and ten samples were randomly selected from the sample group A having a thickness $b_2$ of about 40 $\mu$m to 45 $\mu$m. FIGS. 9 and 10 are the graphs showing the experimental results when the maximum values, minimum values and averaged values of the time-dependent change quantities of the center frequency Fo were measured with respect to the sample groups B and A, respectively. It can be understood from the comparison between FIG. 9 and FIG. 10 that distribution of the change quantity of the center frequency Fo is suppressed by increasing the thickness $b_2$.

As is evident from the foregoing descriptions, change of the resonance frequency caused by the heat imparted to the piezoelectric substrate during reflowing is effectively canceled by preferred embodiments of the present invention by the change of the resonance frequency caused by the synthesized stress imparted to the piezoelectric substrate from the cover substrates and adhesives, by adjusting the elasticity modulus and thickness of the adhesives. Consequently, a laminated piezoelectric component, in which the change quantity of the center frequency before and after a high temperature heat treatment such as reflowing is minimized, can be obtained. In addition, the piezoelectric substrate only experiences the component of the synthesized stress imparted to the piezoelectric substrate form the adhesives, when the stress imparted to the piezoelectric substrate from the cover substrates is absorbed by the adhesives. Therefore, the piezoelectric substrate always experiences an approximately constant stress, thereby allowing the change quantity of the resonance before and after reflowing to be minimized and the distribution thereof to be minimized.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A laminated piezoelectric component comprising:

a plurality of piezoelectric substrates having vibration electrodes disposed on a surface thereof;

a plurality of cover substrates arranged in a stack with the plurality of piezoelectric substrates so as to define a laminated body together with the piezoelectric substrates; and adhesives located between the piezoelectric substrates and the cover substrates so as to bond the piezoelectric substrates to the cover substrates;

wherein an elasticity modulus and thickness of the adhesives are determined so that a change of the resonance frequency, caused by heat applied to the piezoelectric substrate is canceled by a change of the resonance frequency caused by a synthesized stress that is imparted to the piezoelectric substrate from the cover substrates and adhesives; and the value calculated by the following equation is approximately zero:

$$a_2 \times b_2 - a_3 \times b_3 - a_1 \times b_1 \times \exp[-(b_2/c^2) \times 10^7]$$

where $a_1$ (/°C.) and be ($\mu$m) denote the thermal expansion coefficient and thickness of the cover substrates, respectively, $a_2$ (/°C.), $b_2$ ($\mu$m) and c (MPa) denote the thermal expansion coefficient, thickness and elasticity modulus of the adhesives, respectively, and $a_3$ (/°C.) and $b_3$ ($\mu$m) denote the thermal expansion coefficient and thickness of the piezoelectric substrates.

2. A laminated piezoelectric component according to claim 1, wherein the adhesives are arranged such that the stress imparted to the piezoelectric substrate from the cover substrate is absorbed by the adhesive so that the synthesized stress imparted to the piezoelectric substrate only contains a stress component imparted from the adhesive to the piezoelectric substrate.

3. A laminated piezoelectric component according to claim 1, wherein the adhesives are arranged to have an elasticity modulus c and thickness $b_2$, in which the value of $b_2/c^2$ as a coefficient of the equation $\exp[-(b_2/c^2) \times 10^{-7}]$ satisfies the equation $(b_2/c^2) \times 5.0 \times 10^{-7}$ is selected.

4. A laminated piezoelectric component according to claim 1, wherein the value of $b_2/c^2$ is $5.0 \times 10^{-7}$ or more.

5. A laminated piezoelectric component according to claim 1, wherein the plurality of piezoelectric substrates includes at least two piezoelectric substrates.

6. A laminated piezoelectric component according to claim 1, wherein the cover substrates includes at least two piezoelectric substrates.

7. A laminated piezoelectric component according to claim 1, wherein the plurality of piezoelectric substrates are arranged to be sandwiched by the plurality of cover substrates.

8. A laminated piezoelectric component according to claim 1, wherein the plurality of piezoelectric substrates are made of at least one of lead titanate zirconate ceramic, quartz and LiTaO$_3$.

9. A laminated piezoelectric component according to claim 1, wherein the plurality of piezoelectric substrates, the plurality of cover members and the plurality of vibration electrodes are arranged to define a plurality of filters.

10. A laminated piezoelectric component according to claim 9, wherein the plurality of filters are energy-trap longitudinal acoustic mode filters.

11. A laminated piezoelectric component according to claim 9, wherein cavities defining vibration spaces of the plurality of filters are provided in the adhesives.

12. A laminated piezoelectric component according to claim 1, wherein portions of the piezoelectric substrates are polarized in a thickness direction thereof.

13. A laminated piezoelectric component according to claim 1, wherein the stress imparted from the adhesives is greater than other stresses applied to the piezoelectric substrate.

14. A laminated piezoelectric component according to claim 1, wherein the adhesives are arranged around the vibration electrodes on the piezoelectric substrates such that vibration portions of the piezoelectric substrates on which the vibration electrodes are disposed experience a tensile stress imparted from the adhesives.

15. A laminated piezoelectric component according to claim 1, wherein the adhesives have a larger thermal expansion coefficient than the piezoelectric substrates.

16. A laminated piezoelectric component according to claim 1, wherein the adhesives are arranged to impart stress to the piezoelectric substrates such that the center frequency shifts to the higher frequency side.

17. A laminated piezoelectric component according to claim 1, wherein the adhesives are arranged to cause the piezoelectric substrates to experience a substantially constant stress.

* * * * *